United States Patent
Lynch et al.

(10) Patent No.: US 10,205,442 B2
(45) Date of Patent: Feb. 12, 2019

(54) GALVANICALLY ISOLATED DATA ISOLATOR WITH IMPROVED COMMON MODE TRANSIENT REJECTION

(71) Applicant: Analog Devices Global, Hamilton (BM)

(72) Inventors: Michael Lynch, Co. Limerick (IE); Brian Anthony Moane, Raheen (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/230,519

(22) Filed: Aug. 8, 2016

(65) Prior Publication Data
US 2018/0041200 A1    Feb. 8, 2018

(51) Int. Cl.
H03K 3/00 (2006.01)
H03K 5/1252 (2006.01)
H03K 17/56 (2006.01)
H04L 25/02 (2006.01)

(52) U.S. Cl.
CPC .......... *H03K 5/1252* (2013.01); *H03K 17/56* (2013.01); *H04L 25/0266* (2013.01); *H01L 2224/48137* (2013.01)

(58) Field of Classification Search
None
See application file for complete search history.

(56) References Cited

U.S. PATENT DOCUMENTS

| 6,614,666 | B1 | 9/2003 | Chen et al. |
| 8,736,343 | B2 | 5/2014 | Chen et al. |
| 9,031,140 | B2 * | 5/2015 | Zimmanck ........... H04B 5/0025 307/104 |
| 9,706,630 | B2 * | 7/2017 | Miller ................. H02M 7/5387 |
| 2003/0151442 | A1 | 8/2003 | Strzalkowski |
| 2011/0026612 | A1 | 2/2011 | Lombardo et al. |
| 2012/0319743 | A1 * | 12/2012 | Morishita ........... H04L 25/0276 327/110 |
| 2016/0211841 | A1 * | 7/2016 | Harrison ................. H02M 1/44 |

FOREIGN PATENT DOCUMENTS

EP    2 533 482 A1    12/2012

OTHER PUBLICATIONS

International Search Report and Written Opinion dated Nov. 30, 2017 in connection with International Application No. PCT/IB2017/001154.

* cited by examiner

*Primary Examiner* — Lincoln Donovan
*Assistant Examiner* — Khareem E Almo
(74) *Attorney, Agent, or Firm* — Wolf, Greenfield & Sacks, P.C.

(57) ABSTRACT

A transformer based digital isolator is provided that has improved immunity to common mode interference. The improved immunity is provided by placing the transformer in association with an H-bridge drive circuit, and taking additional effort to tailor the on state resistance of the transistors to control a common mode voltage at the transformer.

27 Claims, 5 Drawing Sheets

GALVANICALLY ISOLATED DATA ISOLATOR WITH IMPROVED COMMON MODE TRANSIENT REJECTION

FIELD OF THE DISCLOSURE

The present disclosure relates to a transformer based data isolator where a driver circuit associated with the transformer is modified to improve performance in terms of parameters such as speed and common mode rejection.

BACKGROUND

There are many instances where it is desirable to transmit data between first and second voltage domains whilst maintaining galvanic isolation between those voltage domains. Examples include power and industrial control systems, motor control systems and healthcare applications. It is generally desirable that such data isolators offer high speed data transmission and good immunity to spurious transmissions. One source of spurious data transmission is common mode noise. In general, avoiding spurious transmissions leads designers towards solutions that reduce data throughput, such as bigger voltage swings across a transformer and bigger separation between detection thresholds in a receiver such that the likelihood that common mode noise at the transmitter being erroneously detected as a data signal at the receiver is reduced.

SUMMARY OF THE DISCLOSURE

A transformer based digital isolator is provided that has improved immunity to common mode interference. The improved immunity is provided by placing the transformer in association with an H-bridge drive circuit, and taking additional effort to tailor the on state resistance of the transistors to control a common mode voltage at the transformer.

In accordance with a first aspect of this disclosure there is provided a data isolator including an isolating transformer. The transformer has first and second windings, which can be regarded as primary and secondary windings. In use a transmitter encodes a signal for supply to the primary winding, and the transmitted signal is detected by a receiver connected to the secondary winding. The primary winding is driven by a drive circuit comprising first to fourth transistors arranged in an H-bridge configuration. The primary winding is DC coupled to the H-bridge.

In some designs a coupling capacitor is added in series with the transformer primary in order to stop DC current flow through the transformer and thereby reducing power consumption. However the inventor appreciated that whilst the capacitor reduced DC current flow, it generated a transient in response to common mode disturbances which degraded common mode rejection.

In accordance with a second aspect of this disclosure there is provided a data isolator including an isolating transformer. The transformer has first and second windings, which can be regarded as primary and secondary windings. In use a transmitter encodes a signal for supply to the primary winding, and the transmitted signal is detected by a receiver connected to the secondary winding. The primary winding is driven by a drive circuit comprising first to fourth transistors arranged in an H-bridge configuration. Two of the transistors are P-type devices and two of the transistors are N-type devices. The on-state resistances of the P-type and N-type transistors are matched so as to place a common mode voltage at substantially half of the supply voltage, plus or minus a suitable tolerance of say 10 to 20 percent.

Advantageously the matching is performed by varying the width of the P-type transistors compared to the width of the N-type transistors. Additionally or alternatively the relative dopings within the transistors may be varied.

In general, when an H-bridge driver is formed, the P-type and N-type transistors of the H-bridge are formed with identical sized transistors or similarly sized transistors. Thus the working assumption is that the transistors are well matched. Whilst this is generally true, the inventor realized that the intrinsic difference in on-state resistance between transistors having P-type channels and transistors having N-type channels meant that there was a mismatch between the on-state resistances of the drivers in the H-bridge even though the transistors were formed to be identical or similar in terms of their dimensions. This difference in on-state resistance gives rise to reduced common mode noise immunity. Furthermore, in some embodiments of a transformer based data isolator, a capacitor is included in series with the transformer to limit DC power consumption. Thus the question of matching the transistors was sometimes perceived as a good thing to do for the purpose of controlling rise and fall times of the edges to be similar. The selection of the transistor resistances for common mode rejection was not considered in some designs. Adjusting the properties of the transistors, for example the width of the P-type devices relative to the width of the N-type devices to match their on-state resistance more accurately give rise to an improvement in immunity to common mode transients.

BRIEF DESCRIPTION OF THE DRAWINGS

Embodiments of the present disclosure will be described, by way of non-limiting example only, with reference to the accompanying Figures, in which.

DETAILED DESCRIPTION

Figure 1:
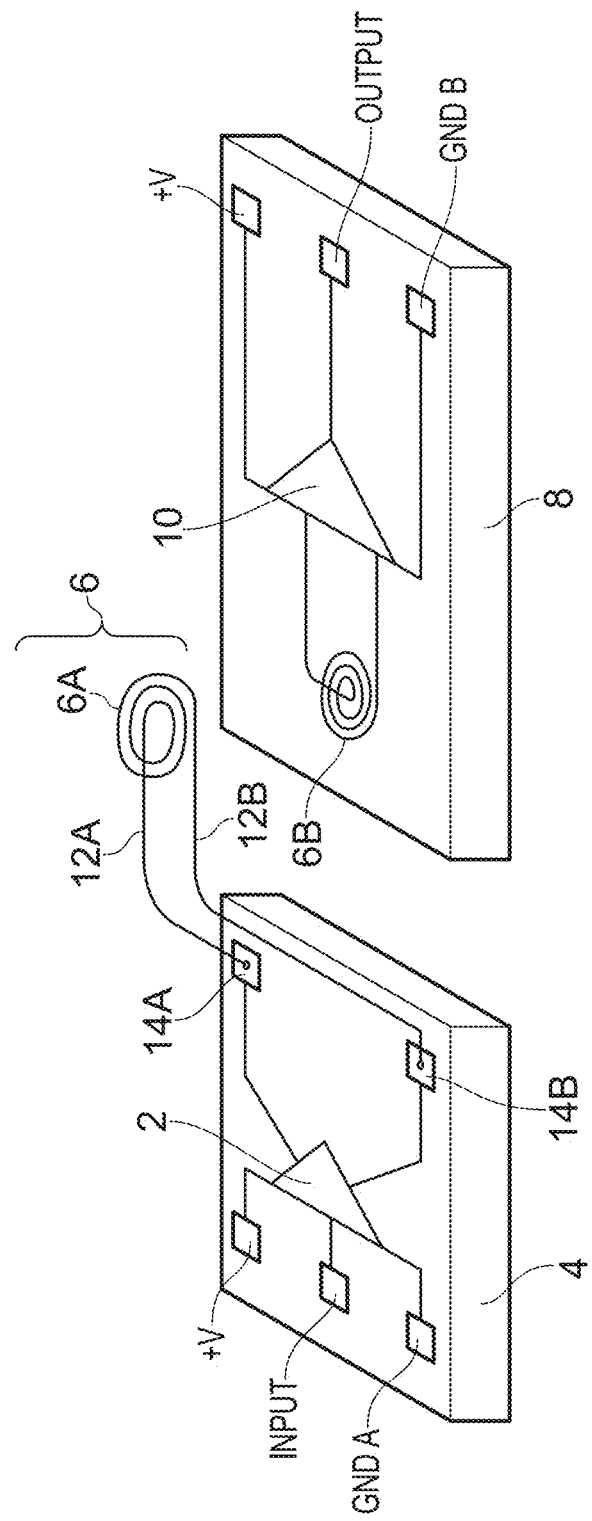
FIG. 1 schematically illustrates a transformer based isolator.

There are many instances where it is desirable to pass a signal across an isolation barrier so as to galvanically isolate first and second voltage domains from one another whilst still maintaining data exchange between the first and second voltage domains. This approach allows low voltage processing electronics in one voltage domain to control high voltage electronics in another domain and optionally to receive information back from the high voltage domain about the outcome of the control actions. An example of a transformer based isolator is shown in FIG. 1. As shown in FIG. 1 a transmitter (or driver) 2 is formed on a first substrate 4. A transformer 6 comprising a first winding 6a and a second winding 6b is formed on a second substrate 8 along with a receiver circuit 10. Wire leads 12a and 12b connect the driver 2 to the first winding 6a which functions as the primary winding by way of bond pads 14a and 14b. Such a circuit provides high levels of galvanic isolation. The winding 6b functions as a secondary winding of the transformer.

Data is encoded in order to transmit it from the transmitter side to the receiver side. Simple encoding schemes, such as ON-OFF keying may be used or more complex schemes exhibiting greater robustness to interference may be used, such as a multi-pulse scheme where, for example, a rising edge in a data signal is encoded as a first number of pulses and the falling edge is encoded as a second number pulses where the first and second numbers are different from each other.

Figure 2:
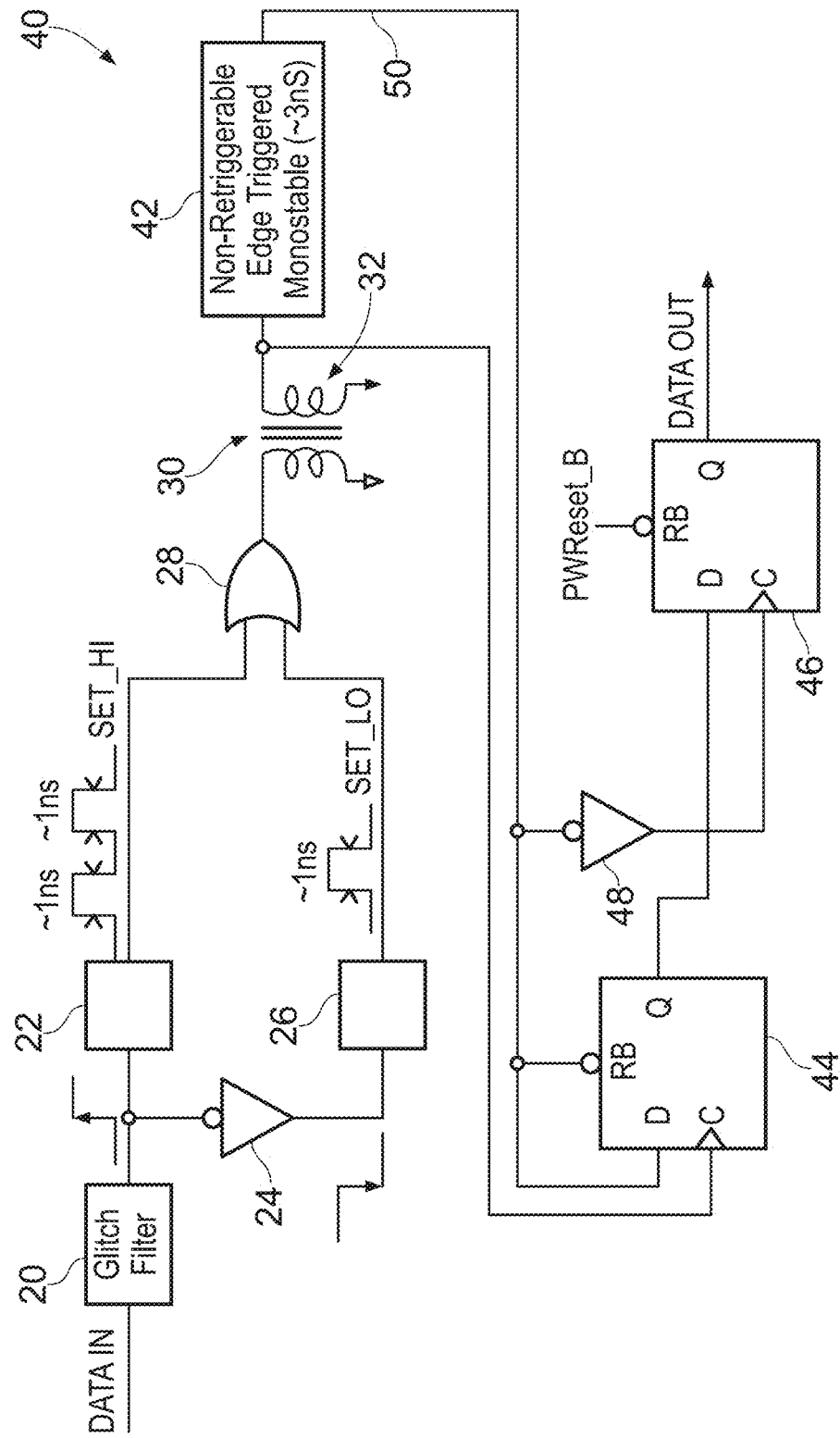
FIG. 2 schematically illustrates a coding scheme where a rising edge of a data signal is encoded differently to a falling edge of a data signal.

FIG. 2 illustrates an encoding and decoding arrangement. Data to be encoded is received at a glitch filter 20 to provide enhanced immunity against noise. An output of the glitch filter 20 is provided to a first rising edge detector 22 which is configured to produce an output signal comprising two short pulses. In this example each pulse is about 1 ns in duration and they are separated by a 1 ns interval. The output of the glitch filter is also provided to an inverter 24 and then to a second edge detector 26 which is arranged to output a single pulse, again in this example of approximately 1 ns duration. The action of the inverter 24 is to make the edge detector 26 responsive to falling edges. Thus it can be seen that rising edges are encoded by a "set_high" signal comprising two pulses and falling edges encoded by "set_low" signal comprising a single pulse. These signals are provided to the primary winding of a transformer 30 by way of suitable combinational logic 28, which in this example is shown as an OR gate. A secondary winding 32 of the transformer 30 provides a signal to a receiver, generally designated 40, which may comprise one or more amplifiers (not shown) as well as one or more comparators (not shown) in order to clean the signal from the secondary winding before providing it to an edge detection apparatus. In this example the edge detection apparatus comprises a non-retriggerable edge triggered monostable 42, a first D-type flip-flop 44, a second D-type flip-flop 46, and an inverter 48. The operation of this circuit is described in U.S. Pat. No. 8,736,343, which is incorporated herein by reference in its entirety. However, briefly, upon receipt of a first pulse at the receiver the pulse clocks the first flip-flop 44 before the non-retriggerable edge triggered monostable 42 has generated an output pulse. Consequently, as the reset to the first flip-flop 44 is active, the Q output of the flip-flop 44 assumes a low state. When the second pulse arrives the data input of the first flip-flop 44 now sees the output pulse 50 from the non-retriggerable edge triggered monostable 42 and the Q output of the first flip-flop 44 transitions to a high value. The falling edge of the monostable pulse 50 is coupled to the clock input of the second flip-flop 46 by way of an inverter 48. Thus on the falling edge the signal at the output of the first flip-flop 44 is clocked into the second flip-flop 46. If two pulses have been received then the output of the first flip-flop 44 will be high, and consequently the data out signal of the second flip-flop will be high. However if only one pulse is received then the output of the first flip-flop 44 will be low and this will be clocked into the second flip-flop 46 such that "data out" will be low. Thus the receiver 40 serves to regenerate the input signal received on the "data in" signal path.

Figure 3:
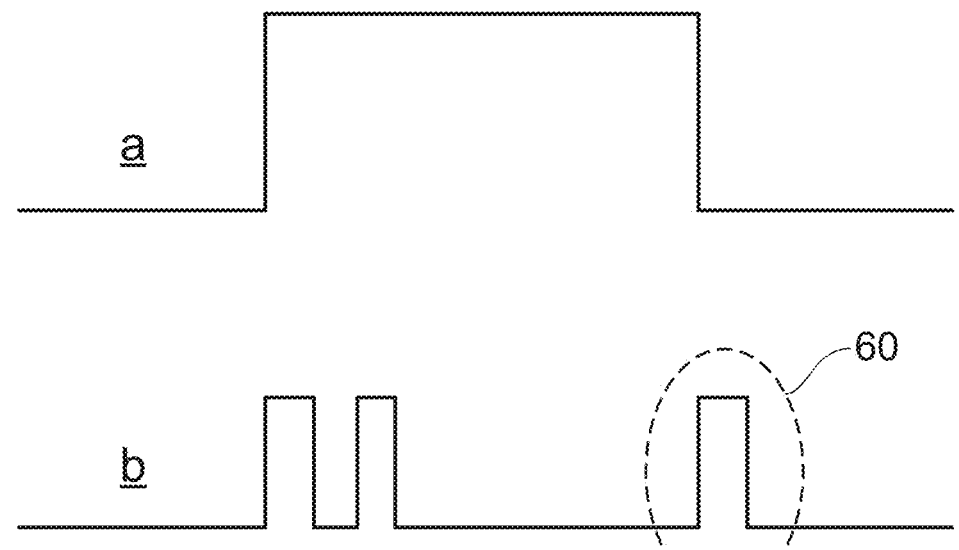
FIG. 3 illustrates an example of a data signal and an encoded representation of that data signal.
Figure 4:
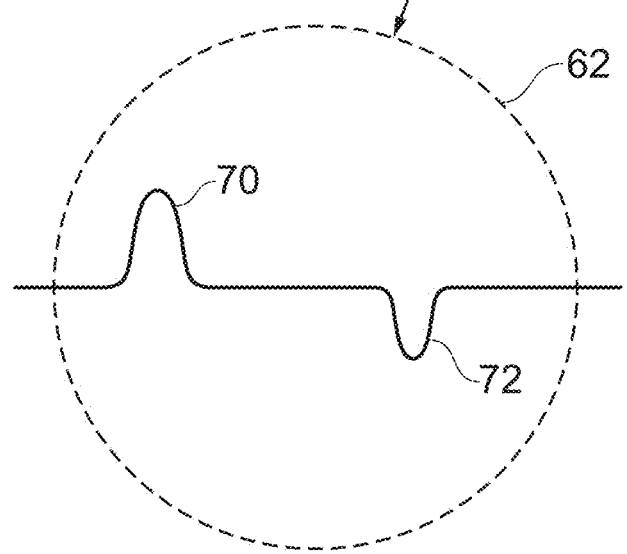
FIG. 4 schematically illustrates single lobe pulses received at the receiver corresponding to rising and falling edges within the encoded pulses transmitted by the transmitter.

For completeness FIG. 3a shows the form of an input signal arriving at the data input "data in", and FIG. 3b shows the encoded signal as provided to the primary winding of the transformer 30. The single pulse representing the falling edge has been encircled by a chain line 60 and the corresponding signal received at the secondary winding of the transformer is shown in FIG. 4 and encircled by chain line 62. FIG. 4 shows that when dealing with short duration pulses the signal received at the output of the secondary winding of the transformer can be in the form of very short duration monophasic pulses (also known as single lobe pulses) where pulse 70 is a monophasic positive going pulse representing the rising edge and pulse 72 is a monophasic negative going pulse representing the falling edge of the data signal.

Figure 5:
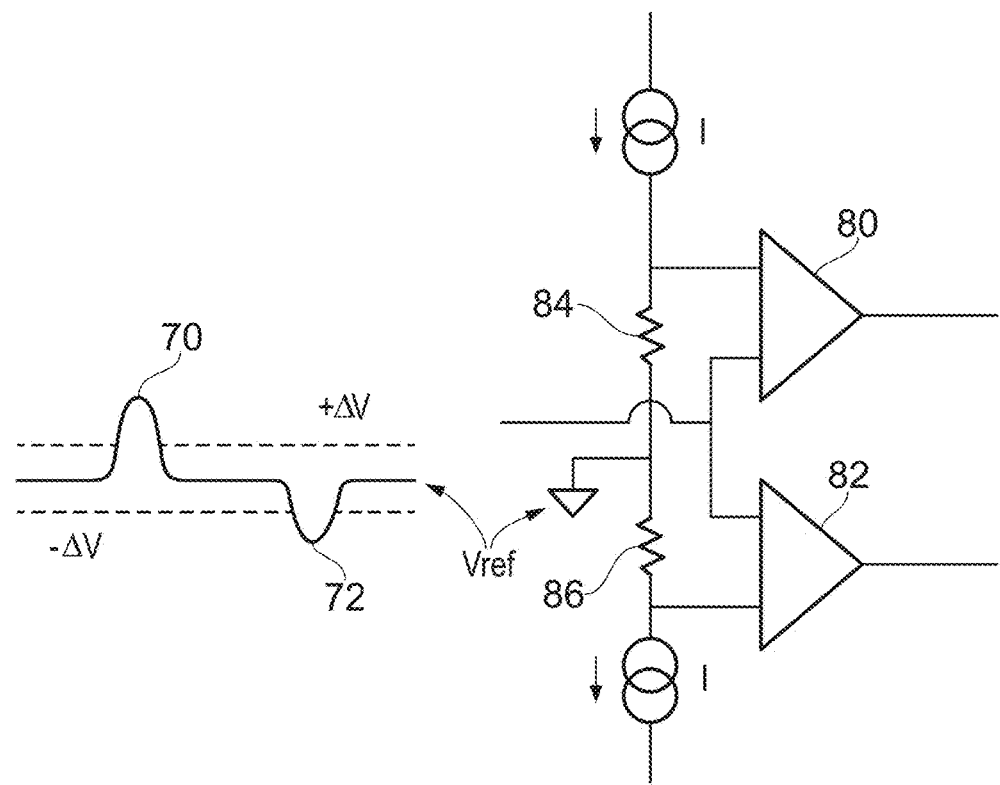
FIG. 5 schematically illustrates the signals at an input stage of a receiver of the galvanic isolator.

FIG. 5 schematically illustrates an embodiment of a receiver that may be used to determine the occurrence of the pulses 70 and 72. The pulses 70 and 72 should be centered around the potential applied to one end of the secondary coil of the transformer. For convenience that voltage will be denoted $V_{ref}$. In the receiver two comparators 80 and 82 acts to decide when a pulse 70 or 72 has been received by comparing the output from the transformer with their own local version of $V_{ref}$ as offset by $+\Delta V$ or $-\Delta V$ where the voltages $\Delta V$ provide hysteresis and hence protection against triggering due to noise or other spurious signals. The offsets $+\Delta V$ or $-\Delta V$ can be generated by passing the current I through resistors 84 and 86 where the node between resistors 84 and 86 is tied to $V_{ref}$ and the node at the opposing ends of the resistors 84 and 86 provide reference voltages to the comparators 80 and 82 respectively. Thus, and in this example, comparator 80 provides a short pulse upon detection of the mono-phase pulse 70, and comparator 82 provides an output pulse upon detection of the negative going mono-phase pulse 72.

There is a tradeoff between speed and power consumption within the transmitter against the width of the hysteresis as provided by the differences between the voltages $+\Delta V$ or $-\Delta V$. In general, reducing the difference between those voltages allows the transmitter to be operated more quickly, but to be more susceptible to noise.

One source of noise is a common mode voltage occurring at the transmitter. A common mode voltage transient should ideally cause the voltages applied at either side of the primary winding of the transformer to rise in unison such that no current flow is induced in the primary and hence there is little risk of transmission of a spurious signal to the secondary. However, as device operating speeds are pushed faster and faster, and hence the bandwidth of the receiver has been increased to cope with those increased data rates, it has become more evident that the single ended drive arrangement shown in FIG. 2 could be improved upon in terms of its robustness against common mode interference.

Figure 6:
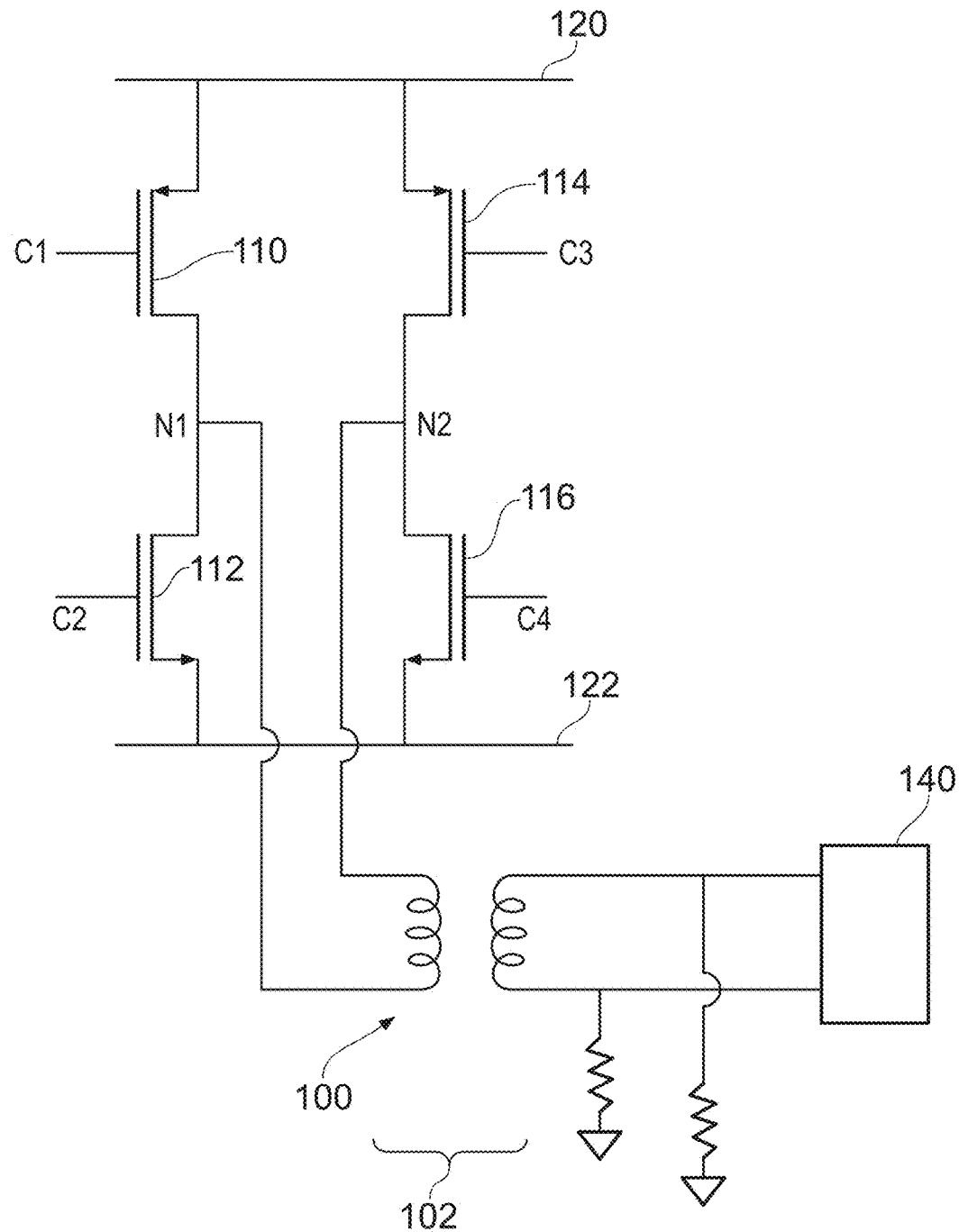
FIG. 6 schematically illustrates a drive arrangement connected to the primary winding of the transformer based galvanic isolator.

FIG. 6 schematically illustrates a driver circuit which, together with other combinational logic if necessary, can take the place of the OR gate 28 of FIG. 2. As shown in FIG. 6 a primary winding 100 of a transformer 102 has a first connection made to node N1 between a first transistor 110 and a second transistor 112; and a second end of the primary winding 100 is connected to node N2 located between a third transistor 114 and a fourth transistor 116. The first to fourth transistors are formed in an "H-bridge" configuration. Thus, as known to the person skilled in the art the first transistor 110 acts as a high side switch for node N1, the second transistor 112 act as a low side switch for node N1, the third transistor 114 acts as a high side switch for node N2, and the fourth transistor 116 acts as a low side switch for node N2. The transistors can be controlled such that either they are all off, the first and fourth transistors 110 and 116 are conducting to generate a magnetic field of a first polarity or direction in the coil, or the transistors 112 and 114 are conducting to generate the magnetic field of a second direction. To maximize the magnitude of the pulses the coil can be operated such that most of the time the current flow is in one direction through the coil and for the generation of each pulse that current flow is reversed at the start of each pulse and returned to its initial direction at the end of each pulse.

As shown, the first transistor 110 and the third transistor 114 are implemented as P-type transistors responsive to respective control signals C1 and C3. The second transistor 112 and the fourth transistor 116 are implemented as N-type transistors responsive to respective control signals C2 and C4. The primary winding 100 is coupled to the nodes N1 and N2 without the inclusion of a DC blocking capacitor.

In the context of data transmission (as opposed to power transmission) a DC blocking capacitor may be included. If there was a long period of time of no data transmission, then the combination of the H-bridge circuit with a transformer primary in series with a DC blocking capacitor would not consume power from the power supply. However the circuit in FIG. 6 will consume power even when no data is transmitted, although it would be possible to place the circuit to sleep by making all of the transistors 110, 112, 114 and 116 of the H-bridge high impedance.

The inventor realized that the series connected DC blocking capacitor interacts with the on state resistances of the transistors to introduce voltage and current perturbations in response to common mode interference on the supply lines 120 and 122. Removing the capacitor was found to trade power consumption for improvements in speed and common mode rejection.

In the event of a common mode interferer arriving at the supply rails 120 and 122 the nodes N1 and N2 substantially track each other as to a first approximation the ON resistance of each transistor that is ON is approximately the same, and the parasitic capacitance across those transistors which are OFF are also approximately the same.

However, the inventor noted that although the H-bridge arrangement provides much better immunity to common mode noise, it still allows some noise to propagate, because the ON resistance of the P-type transistors is not the same as the ON resistance of the N-type transistors. This variation in resistance means that the voltage perturbations of nodes N1 and N2 do not accurately track each other when the common mode voltage change arrives, and consequently this can give rise to a current flow path between nodes N1 and N2 via the primary winding of the transformer and hence gives rise to the possibility of a spurious signal being transmitted to the receiver 140. Similarly if, for example, a P type transistor is formed inside an additional isolating well compared to an N type transistor (or vice versa), then this can give rise to a variation in parasitic capacitance.

The inventor realized that in order to address this the aspect ratio of the transistors should be varied slightly rather than making them of identical or similar size. In the prior art, the length and width of the P-type transistor 110 would be identical or similar to the length and width of the N-type transistor 112. However, because P-type mobility is less than N-type mobility this gives rise to a transistor having a larger ON resistance. The inventor realized that either the P-type transistors should be made significantly wider compared to the corresponding N-type transistors, or the N-type transistors should be made slightly longer compared to the corresponding P-type transistors or both of these modifications could be applied at the same time in order to match the ON state resistance of the transistors to an acceptable degree of accuracy. In practice, the ON state resistances should be selected such that the common mode voltage of the circuit is substantially half the supply voltage, i.e. half way between the voltage on line 120 and the voltage on line 122 give or take a margin of error. The margin of error may be 10%, 5%, 2%, 1%, 0.5% or less. The common mode voltage can be measured as the voltage at the mid-point of the primary winding 100. As a result common mode interference, i.e. a voltage change of magnitude X volts occurring on lines 120 and 122 simultaneously, should give rise to a change of X volts at the center of the transformer such that, in relative terms, the voltages at a midpoint of the primary winding and the supply voltages all move together by the same amount, give or take a margin of error.

Often a semiconductor device manufacturer outsources manufacture of components to a fabrication facility. An example of such a fabricator is TSMC (Taiwan semiconductor manufacturing company Limited). Such fabricators develop their own processes which they offer. The intellectual property and know how around such processes is managed such that customers may not get information about specific doping levels or control over those levels, but are given help and guidance about setting device dimensions to achieve specific characteristics. In one example, an H-bridge has PMOS transistors having a dimension of 150/0.5 which corresponds to a width of 150 units and a length of 0.5 units. The default unit size depends on the technology node chosen to fabricate the device on—and in this example 1 unit=1 micron. NMOS devices in the H-bridge have dimensions 120/0.5. In some embodiments, the P type transistors are about 25% wider than the N type transistors, or the aspect ratio matches to within approximately 25% to 30%. In an example of a driver formed on the same technology node and the P-type device still has dimensions 150/0.5 but the N type device has dimensions of 40/0.5. It can been seen that the P type device is more than 3 times wider than the N type device. Relative doping varies from fabricator to fabricator and process to process, but in general for the H-bridge driver for the transformer prior art processes will have transistor widths match to within a factor of 1.5 whereas for devices formed in accordance with the teachings of this disclosure the transistor widths vary by greater than a factor of 2, sometimes by more than 2.5, sometimes by more than 3, and sometimes by more than 3.5 (e.g., between 2 and 10 in some embodiments).

By reducing the risk of common mode interference and use of an H bridge, data rates in excess of 500 million bits per second can be achieved.

Thus by moving to an H-bridge driver for the transformer of the isolator, and by realizing that including a DC blocking capacitor degraded both speed and common mode rejection, the inventor has achieved a considerable increase in data throughput whilst maintaining data integrity.

The claims presented herein are in single dependency format suitable for filing at the USPTO. However it is to be understood that each claim can be dependent on any preceding claim unless that is clearly infeasible.

The invention claimed is:

1. A data isolator comprising:
   a transformer including a primary winding and a secondary winding, the primary winding having first and second connections to an H-bridge circuit comprising a plurality of transistors; and
   wherein the primary winding of the transformer is connected to the H-bridge circuit without a DC blocking component, the H-bridge circuit is configured to control a current flow in the primary winding of the transformer, and the plurality of transistors have on-state resistances such that a voltage at a midpoint of the primary winding is substantially at a common mode voltage of the H-bridge circuit.

2. The data isolator as claimed in claim 1, wherein the H-bridge circuit is configured to provide an encoded signal to the primary winding of the transformer to induce a signal in the secondary winding of the transformer and wherein the data isolator further comprises a receiver to reconstruct a data signal based on the signal induced in the secondary winding of the transformer.

3. The data isolator as claimed in claim 2, wherein the signal induced in the secondary winding of the transformer comprises monophasic pulses.

4. The data isolator as claimed in claim 2, wherein the receiver is configured to reconstruct the data signal at least in part by detecting a voltage difference between first and second nodes of the secondary winding.

5. The data isolator as claimed in claim 4, wherein a sign of the voltage difference is indicative of a direction of current flow or change of direction of current flow in the primary winding of the transformer.

6. The data isolator as claimed in claim 1, wherein the plurality of transistors includes first and second P-type transistors and first and second N-type transistors.

7. The data isolator as claimed in claim 6, wherein the on-state resistance of the plurality of transistors is matched and wherein the first and second P-type transistors have different doping concentrations than the first and second N-type transistors.

8. The data isolator as claimed in claim 6, wherein the on-state resistance of the plurality of transistors is matched and wherein the first and second P-type transistors have a different size than the first and second N-type transistors.

9. The data isolator as claimed in claim 6, further comprising a resistance coupled in series with one or more of the plurality of transistors such that the on-state resistance of the plurality of transistors is matched.

10. The data isolator as claimed in claim 2, wherein the encoded signal comprises a first sequence of pulses representative of a rising edge in the data signal and a second sequence of pulses representative of a falling edge in the data signal that is different from the first sequence of pulses.

11. The data isolator as claimed in claim 6, wherein the first and second P-type transistors have an aspect ratio that differs from the aspect ratio of the first and second N-type transistors by more than a factor of 2.

12. The data isolator as claimed in claim 11, wherein the first and second P-type transistors have an aspect ratio that differs from the aspect ratio of the first and second N-type transistors by more than a factor of 3.

13. The data isolator as claimed in claim 11, wherein the first and second P-type transistors have an aspect ratio that differs from the aspect ratio of the first and second N-type transistors by more than a factor of 3.5.

14. The data isolator as claimed in claim 1, wherein the transformer is a micro transformer.

15. The data isolator as claimed in claim 1, wherein the data isolator is provided in a chip scale package.

16. An isolator comprising:
a transformer including a primary winding configured to be driven by a H-bridge circuit, wherein the H-bridge circuit comprises a plurality of controllable current paths, and an on-state resistance of each current flow path in the plurality of controllable current paths is matched to an associated current flow path in the plurality of controllable current paths.

17. The isolator as claimed in claim 16, wherein the on-state resistances are matched such that voltage changes at first and second nodes of the primary winding caused by a common mode voltage change are substantially equal.

18. The isolator as claimed in claim 16, wherein the transformer is a micro transformer and the isolator is provided in a chip scale package.

19. A method of operating an isolator comprising a transformer, the method comprising:
driving a primary winding of the transformer by a H-bridge circuit, where the on-state impedance at first and second connections to the primary winding are substantially matched.

20. The method as claimed in claim 19, wherein the transformer is DC coupled to the H-bridge circuit.

21. A data isolator comprising:
a micro transformer including a primary winding and a secondary winding, the primary winding having first and second connections to an H-bridge circuit; and
wherein the primary winding of the micro transformer is connected to the H-bridge circuit without a DC blocking component and the H-bridge circuit is configured to control a current flow in the primary winding of the micro transformer.

22. The data isolator as claimed in claim 21, wherein the H-bridge circuit is configured to provide an encoded signal to the primary winding of the micro transformer to induce a signal in the secondary winding of the micro transformer and wherein the data isolator further comprises a receiver to reconstruct a data signal based on the signal induced in the secondary winding of the micro transformer.

23. The data isolator as claimed in claim 22, wherein the encoded signal comprises a first sequence of pulses representative of a rising edge in the data signal and a second sequence of pulses representative of a falling edge in the data signal that is different from the first sequence of pulses.

24. The data isolator as claimed in claim 22, wherein the signal induced in the secondary winding of the micro transformer comprises monophasic pulses.

25. The data isolator as claimed in claim 22, wherein the receiver is configured to reconstruct the data signal at least in part by detecting a voltage difference between first and second nodes of the secondary winding.

26. The data isolator as claimed in claim 25, wherein a sign of the voltage difference is indicative of a direction of current flow or change of direction of current flow in the primary winding of the micro transformer.

27. The data isolator as claimed in claim 21, wherein the data isolator is provided in a chip scale package.

* * * * *